(12) United States Patent
Liu et al.

(10) Patent No.: US 9,466,809 B2
(45) Date of Patent: Oct. 11, 2016

(54) OLED PACKAGING METHOD AND STRUCTURE

(71) Applicant: Shenzhen China Star Optoelectronics Technology Co., Ltd., Shenzhen, Guangdong (CN)

(72) Inventors: Yawei Liu, Guangdong (CN); Yifan Wang, Guangdong (CN); Changcheng Lo, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 76 days.

(21) Appl. No.: 14/430,200

(22) PCT Filed: Sep. 11, 2014

(86) PCT No.: PCT/CN2014/086263
§ 371 (c)(1),
(2) Date: Mar. 20, 2015

(87) PCT Pub. No.: WO2016/026182
PCT Pub. Date: Feb. 25, 2016

(65) Prior Publication Data
US 2016/0248043 A1  Aug. 25, 2016

(30) Foreign Application Priority Data
Aug. 21, 2014  (CN) .......................... 2014 1 0415935

(51) Int. Cl.
*H01L 33/00* (2010.01)
*H01L 51/52* (2006.01)
*H01L 51/56* (2006.01)
*H01L 23/544* (2006.01)
*H01L 27/32* (2006.01)

(52) U.S. Cl.
CPC .......... *H01L 51/5246* (2013.01); *H01L 23/544* (2013.01); *H01L 27/3244* (2013.01); *H01L 51/5259* (2013.01); *H01L 51/56* (2013.01); *H01L 2223/54426* (2013.01); *H01L 2227/323* (2013.01); *H01L 2251/303* (2013.01); *H01L 2251/558* (2013.01)

(58) Field of Classification Search
CPC ............. H01L 51/5246; H01L 23/544; H01L 51/5259; H01L 51/56
See application file for complete search history.

(56) References Cited

U.S. PATENT DOCUMENTS

2007/0172971 A1  7/2007  Boroson

FOREIGN PATENT DOCUMENTS

| CN | 1124466 A | 6/1996 |
|---|---|---|
| CN | 103264014 A | 8/2013 |
| CN | 103337593 A | 10/2013 |

*Primary Examiner* — Tracie Y Green
(74) *Attorney, Agent, or Firm* — Andrew C. Cheng

(57) ABSTRACT

The present invention provides an OLED packaging method and structure. The method includes the following steps: providing an OLED substrate (1) and a package cover (4) and forming an alignment mark on the package cover (4); forming a circle of patternized desiccant layer (3) on the package cover (4); coating a circle of frame resin (5) on the package cover (4) at an outer side of the desiccant layer (3); attaching the package cover (4) and the OLED substrate (1) to each other; and subjecting the frame resin (5) to irradiation of a UV light source or heating for curing so as to complete packaging of the OLED substrate (1) with he package cover (4).

11 Claims, 4 Drawing Sheets

OLED PACKAGING METHOD AND STRUCTURE

BACKGROUND OF THE INVENTION

1. Field of the Invention

The present invention relates to the field of display technology, and in particular to an OLED (Organic Light-Emitting Diode) packaging method and structure.

2. The Related Arts

In the field of display technology, flat panel display technology (such as liquid crystal display (LCD) and Organic Light Emitting Diode (OLED)) has been gradually replacing cathode ray tube (CRT) displays. Flat light source technology is a novel light source, of which the development of techniques thereof has approached the level of commercialized mass production. In the flat panel display and flat light source technology, bonding of two parallel glass panels is an important technique of which the packaging effect directly affects the device performance.

Ultraviolet (UV) curing is the earliest and most commonly used technique for LCD/OLED packaging and has the following advantages: involving the use of no or a small amount of solvent so as to reduce environmental pollution caused by the solvent; consuming less energy, being curable in a low temperature and applicable to heat sensitive materials; and high curing speed and high efficiency, allowing for use in high speed manufacturing lines and having small footprint of the curing facility. However, UV resin is an organic material, which, after being cured, has relatively large gaps among the molecules thereof, allowing for easy penetration of moisture and oxygen through the medium to reach the internal sealed area. Thus, it better suits for applications in fields that are not sensitive to moisture and oxygen, such as LCD. However, OLED devices are very sensitive to moisture and oxygen and it is commonly to arrange a desiccant in the interior of a device when UV packaging is adopted in order to reduce the moisture that reaches the internal sealed area for extension of the lifespan of the OLED device.

FIG. 1 illustrates a commonly used OLED packaging method, in which a recess is first formed in a package cover 400 and a desiccant 300 is disposed in the recess of the cover 400, followed by application of frame resin 500, and finally the package cover 400 and an OLED substrate 100 are laminated and packaged together. FIG. 2 shows an other commonly used OLED packaging method, in which a layer of desiccant 300' is directly coated on a package cover 400', followed by application of a frame resin 500' and finally, the package cover 400' and an OLED substrate 100' are laminated and packaged together. However, these two methods are both not suitable for top lighting arrangements (for light being not allowed to project out in the direction of the package cover), because light transmittance gets deteriorated after the desiccant absorbs moisture. Further, the moisture, after penetrating through the frame resin, may move around in the sealed area and may be absorbed by the desiccant or get attached to a surface of the OLED device. This may cause damages of the OLED device at the time when the moisture enters the sealed area.

SUMMARY OF THE INVENTION

An object of the present invention is to provide a an OLED packaging method, with which method, an packaging effect can be improved to enhance the performance of blocking moisture and oxygen, extending the lifespan of an OLED device, and which method is applicable to packaging of the structure bottom lighting devices, the structure of top lighting devices, planar light sources, and other packages that requires desiccation.

Another object of the present invention is to provide an OLED packaging structure, which has an excellent packaging effect, enhanced performance of blocking moisture and oxygen, and extended lifespan.

To achieve the above objects, the present invention provides an organic light emitting diode (OLED) packaging method, which comprises the following steps:

(1) providing an OLED substrate and a package cover and forming an alignment mark on the package cover;

(2) forming a circle of patternized desiccant layer on the package cover;

(3) coating a circle of frame resin on the package cover at an outer side of the desiccant layer;

(4) attaching the package cover and the OLED substrate to each other; and (5) subjecting the frame resin to irradiation of a UV light source or heating for curing so as to complete packaging of the OLED substrate with the package cover.

The package cover is a glass substrate or a metal board; and the OLED substrate comprises a thin-film transistor (TFT) array formed thereon.

In step (2), the desiccant layer is formed on the package cover at an inner side of a resin application location where the frame resin is to be formed and in step (3), the frame resin is coated on the package cover at the resin application location where the frame resin is to be formed in such a way that the frame resin is immediately adjacent to the desiccant layer.

In step (2), an operation for forming the patternized desiccant layer is to directly cut a desiccant sheet into a desired pattern, which is attached to the package cover immediately adjacent to the inner side of the resin application location, the desiccant layer having a width of 100 um-2000 um and a height of 1 um-100 um.

In step (2), an operation for forming the patternized desiccant layer is to first make a desiccant into a solution, which is coated, through application or screen printing, on the package cover at the inner side of the resin application location, the positioning the package cover in a high temperature over for baking for hours at 120° C.-350° C. to remove a solvent from the desiccant solution so as to allow the desiccant to solidify and form the desiccant layer, the desiccant layer having a width of 100 um-2000 um and a height of 1 um-100 um.

In step (2), the desiccant layer comprises a molecular sieve film, the molecular sieve being silicates or aluminosilicates in a crystallized form.

In step (2), an operation for forming the patternized desiccant layer is to first grind 4 A molecular sieve into powder, the powder particle size being 1 um-100 um, and to add water to make a paste, the molecular sieve being coated, through screen printing, on the package cover at the inner side of the resin application location, and then to position the package cover in a high temperature oven for baking for hours at 120° C.-350° C. to remove water and form the molecular sieve film, the molecular sieve film having a width of 100 um-2000 um and a height of 1 um-100 um.

In step (3), the frame resin comprises an ultraviolet (UV) resin and the frame resin has a height corresponding to that of the desiccant layer.

The present invention also provides a n organic light emitting diode (OLED) packaging structure, comprising an OLED substrate, a package cover arranged above the OLED substrate, a frame resin arranged between the OLED substrate and the package cover, and a desiccant layer arranged between the OLED substrate and the package cover and located at an inner side of the frame resin.

The package cover comprises a glass substrate or a metal board. The OLED substrate comprises a thin-film transistor (TFT) array formed thereon. The frame resin is set immediately adjacent to the desiccant layer. The desiccant layer has a width of 100 um-2000 um and a height of 1 um-100 um. The desiccant layer comprises a molecular sieve film. The molecular sieve comprises silicates or aluminosilicates in a crystallized form. The frame resin comprises a ultraviolet (UV) resin. The frame resin has a height corresponding to that of the desiccant layer.

The efficacy of the present invention is that the present invention provides an OLED packaging method and structure, in which a desiccant layer is patternized to expose and thus not shield a light emitting zone so that light emitting from OLED is allowed to project out through the package cover and also to project out through the OLED substrate. The packaging method is applicable to packaging a top lighting device and is equally applicable to packaging a bottom lighting device. Further, no gap is present at the contact sites between the desiccant layer and the package cover and the OLED substrate and moisture intruding the frame resin will be immediately absorbed by the desiccant so that the moisture has no chance and no transmission path to reach a surface of an OLED device thereby ensuring absolute safety of the OLED device within a long period of time before the desiccant gets saturated with absorbed water. Further, blocking achieved with the desiccant cuts off a path through which oxygen reaches a surface of the OLED device in a sealed area so as to greatly reduce the damage of the OLED device caused by oxygen.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
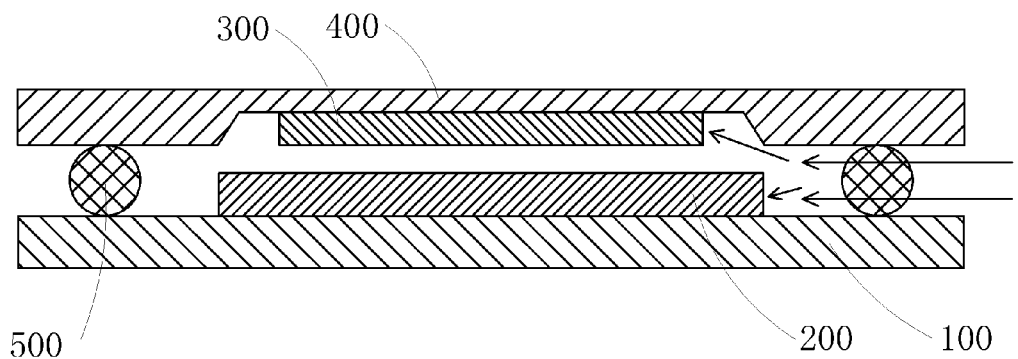
FIG. 1 is a cross-sectional view showing a conventional OLED packaging structure.
Figure 2:
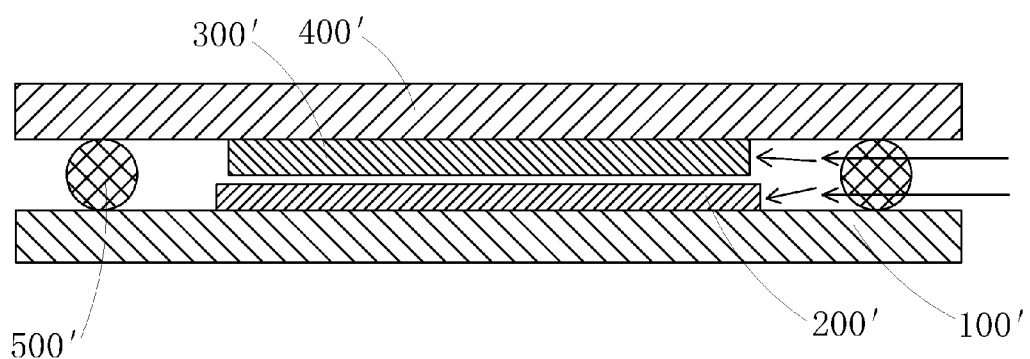
FIG. 2 is a cross-sectional view showing another conventional OLED packaging structure.
Figure 3:
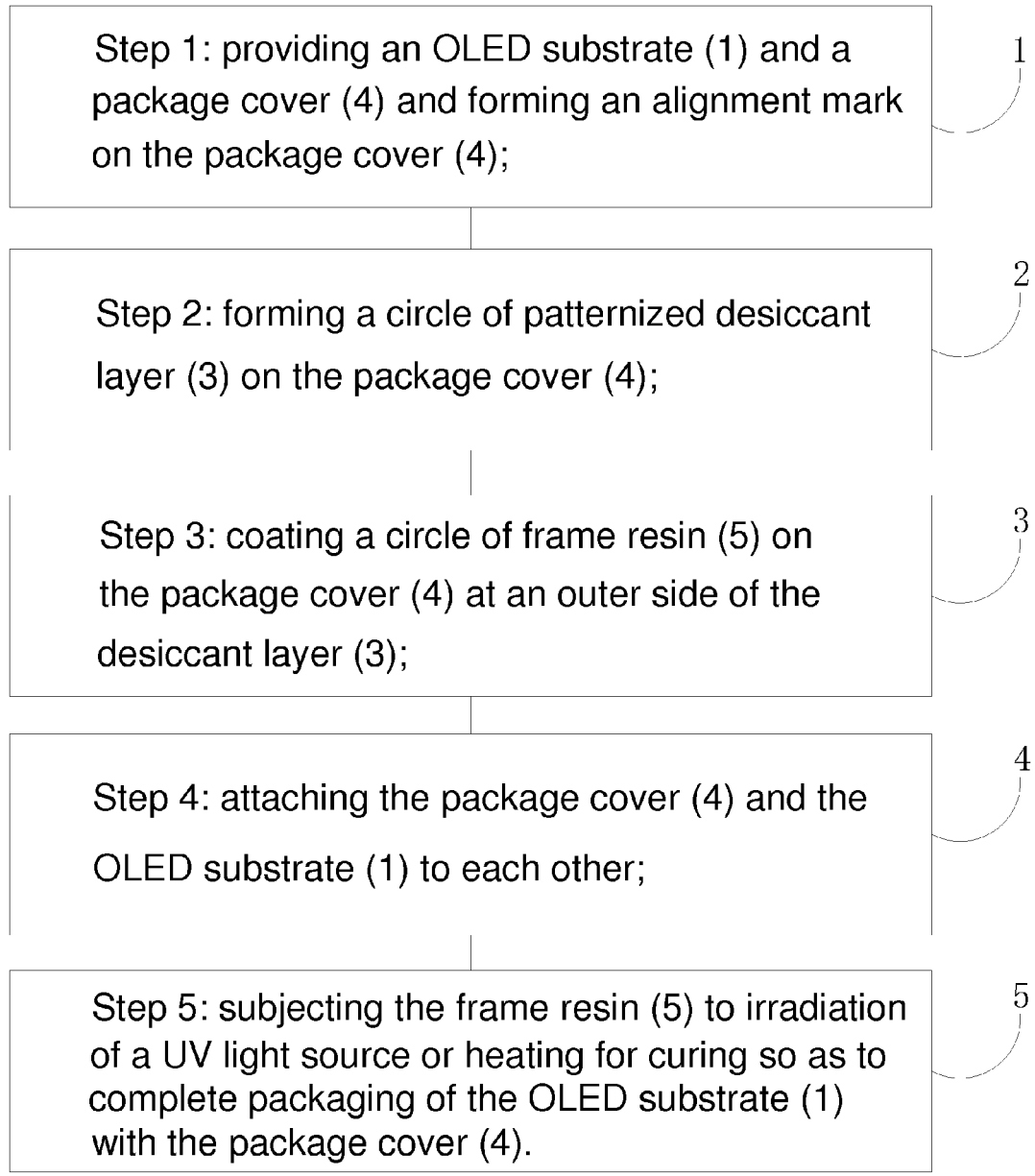
FIG. 3 is a flow chart illustrating an OLED packaging method according to the present invention.
Figure 4:
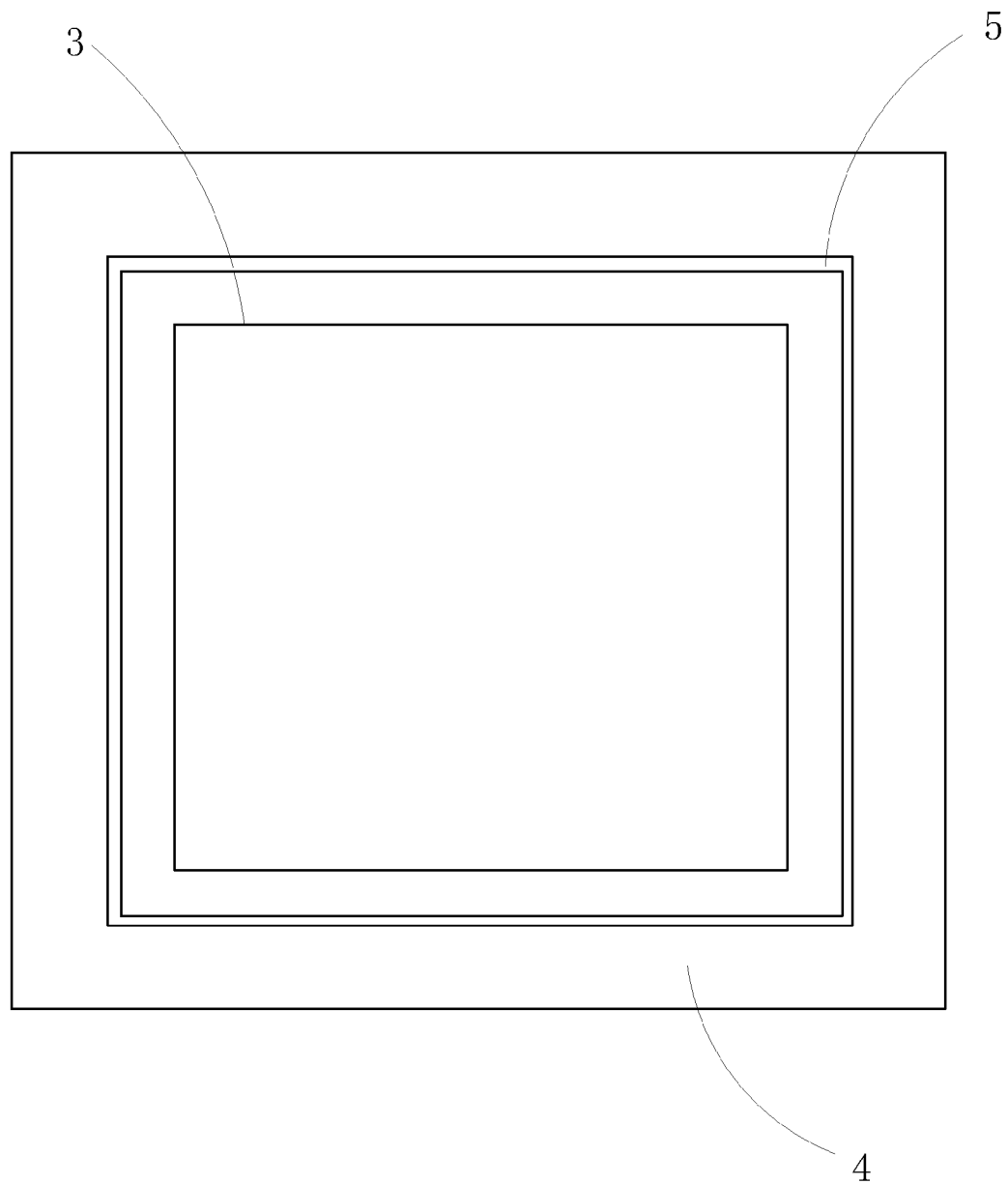
FIG. 4 is a top plan view showing a package cover used in the OLED packaging method according to the present invention.
Figure 5:
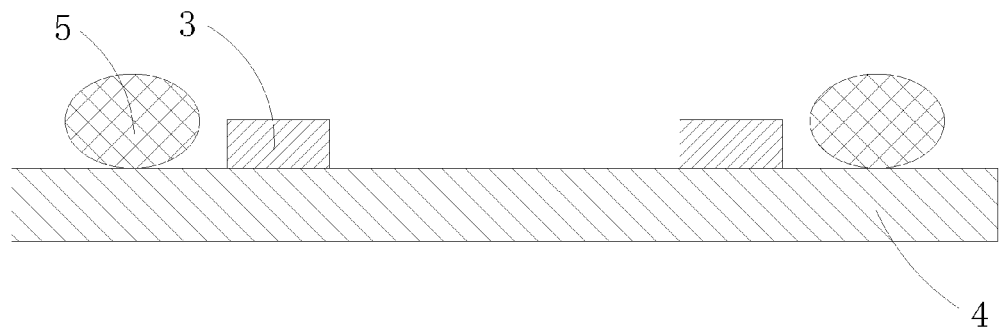
FIG. 5 is a cross-sectional view showing the package cover used in the OLED packaging method according to the present invention.
Figure 6:
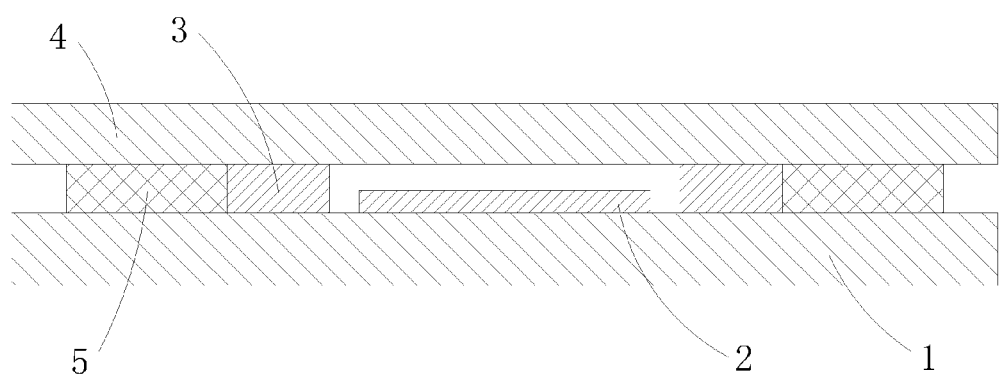
FIG. 6 is a cross-sectional view showing and OLED packaging structure according to the present invention.

Referring to FIGS. 3-6, the present invention provides an OLED (Organic Light Emitting Diode) packaging method, which comprises the following steps:

Step 1: providing an OLED substrate 1 and a package cover 4 and forming an alignment mark on the package cover 4.

In this step, the alignment mark is provided for ensuring correct lamination between the OLED substrate 1 and the package cover 4 in the subsequent steps. The package cover 4 can be a glass substrate or a metal board, and preferably, the package cover 4 is a glass substrate. The OLED substrate 1 comprises a TFT (Thin-Film Transistor) array formed thereon.

Step 2: forming a circle of patternized desiccant layer 3 on the package cover 4.

In this step, the desiccant layer 3 is formed on an inner side of a resin application location where a frame resin 5 is applied to the package cover 4 in order to ensure moisture that invades the frame resin 5 will be immediately absorbed by the desiccant layer 3 and to provide the moisture with no chance and no transmission path to reach a surface of an OLED device 2 so as to ensure the safety the OLED device 2 within a long period of time before the desiccant layer 3 gets saturated with absorption of water. Further, blocking achieved with the desiccant layer 3 cuts off a path through which oxygen reaches a surface of the OLED device 2 in a sealed area so as to effectively reduce the damage of the OLED device 2 caused by oxygen.

Specifically, in the formation of the patternized desiccant layer 3, a currently available desiccant sheet can be directly cut into a desired pattern, which is attached to the package cover 4 immediately adjacent to the inner side of the resin application location. The desiccant layer 3 has a width of 100 um-2000 um and a height of 1 um-100 um.

The formation of the patternized desiccant layer 3 may alternatively be achieved by first making a desiccant agent into a solution and the desiccant solution is coated, through application or screen printing, on the package cover 4 at the inner side of the resin application location. Then, the package cover 4 is positioned in a high temperature oven and is baked for several hours at a temperature of 120° C.-350° C. to remove the solvent of the desiccant solution, thereby solidifying and forming the desiccant layer 3. The desiccant layer 3 has a width of 100 um-2000 um and a height of 1 um-100 um.

Further, the desiccant layer 3 can alternatively be a molecular sieve film and the molecular sieve can be silicates or aluminosilicates in a crystallized form.

The formation of the patternized desiccant layer 3 with the molecular sieve film is first grinding 4 A molecular sieve into powder with the powder particle size being 1 um-100 um and then adding water to make a paste. The molecular sieve paste is then coated, through screen printing, on the package cover 4 at the inner side of the resin application location. Then, the package cover 4 is positioned in a high temperature oven and is baked for several hours at a temperature of 120° C.-350° C. to remove water to form the molecular sieve film. The molecular sieve film has a width of 100 um-2000 um and a height of 1 um-100 um.

Step 3: coating a circle of frame resin 5 on the package cover 4 at an outer side of the desiccant layer 3.

In this step, a frame resin 5 is coated on the package cover 4 at a resin application location where the frame resin 5 is to be formed in such a way that the frame resin 5 is immediately adjacent to the desiccant layer 3. The frame resin 5 can be a UV (Ultraviolet) resin. The frame resin 5 has a height corresponding to the height of the desiccant layer 3 in order to ensure no gap is present at contact sites between the desiccant layer 3 and the package cover 4 and the OLED substrate 1 to better ensure the OLED device 2 will not be damaged by water or oxygen. The frame resin 5 is coated on the resin application location for the purpose of bonding the package cover 4 and the OLED substrate 1 together.

Step 4: attaching the package cover 4 and the OLED substrate 1 to each other.

In this step, the package cover 4 and the OLED substrate 1 are laminated together according to the alignment mark (not shown) formed in Step 1.

Step 5: subjecting the frame resin 5 to irradiation of a UV light source or heating for curing so as to complete packaging of the OLED substrate 1 with the package cover 4.

In summary, the present invention provides an OLED packaging method and structure, in which a desiccant layer is patterned to expose and thus not shield a light emitting zone so that light emitting from OLED is allowed to project out through the package cover and also to project out through the OLED substrate. The packaging method is applicable to packaging a top lighting device and is equally applicable to packaging a bottom lighting device. Further, no gap is present at the contact sites between the desiccant layer and the package cover and the OLED substrate and moisture intruding the frame resin will be immediately absorbed by the desiccant so that the moisture has no chance and no transmission path to reach a surface of an OLED device thereby ensuring absolute safety of the OLED device within a long period of time before the desiccant gets saturated with absorbed water. Further, blocking achieved with the desiccant cuts off a path through which oxygen reaches a surface of the OLED device in a sealed area so as to greatly reduce the damage of the OLED device caused by oxygen.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An organic light emitting diode (OLED) packaging method, comprising the following steps:
   (1) providing an OLED substrate and a package cover and forming an alignment mark on the package cover;
   (2) forming a circle of patternized desiccant layer on the package cover;
   (3) coating a circle of frame resin on the package cover at an outer side of the desiccant layer;
   (4) attaching the package cover and the OLED substrate to each other; and
   (5) subjecting the frame resin to irradiation of a UV light source or heating for curing so as to complete packaging of the OLED substrate with the package cover.

2. The OLED packaging method as claimed in claim 1, wherein the package cover is a glass substrate or a metal board; and the OLED substrate comprises a thin-film transistor (TFT) array formed thereon.

3. The OLED packaging method as claimed in claim 1, wherein in step (2), the desiccant layer is formed on the package cover at an inner side of a resin application location where the frame resin is to be formed and in step (3), the frame resin is coated on the package cover at the resin application location where the frame resin is to be formed in such a way that the frame resin is immediately adjacent to the desiccant layer.

4. The OLED packaging method as claimed in claim 3, wherein in step (2), an operation for forming the patternized desiccant layer is to directly cut a desiccant sheet into a desired pattern, which is attached to the package cover immediately adjacent to the inner side of the resin application location, the desiccant layer having a width of 100 um-2000 um and a height of 1 um-100 um.

5. The OLED packaging method as claimed in claim 3, wherein in step (2), an operation for forming the patternized desiccant layer is to first make a desiccant into a solution, which is coated, through application or screen printing, on the package cover at the inner side of the resin application location, the positioning the package cover in a high temperature over for baking for hours at 120° C.-350° C. to remove a solvent from the desiccant solution so as to allow the desiccant to solidify and form the desiccant layer, the desiccant layer having a width of 100 um-2000 um and a height of 1 um-100 um.

6. The OLED packaging method as claimed in claim 3, wherein in step (2), the desiccant layer comprises a molecular sieve film, the molecular sieve being silicates or aluminosilicates in a crystallized form.

7. The OLED packaging method as claimed in claim 6, wherein in step (2), an operation for forming the patternized desiccant layer is to first grind 4 A molecular sieve into powder, the powder particle size being 1 um-100 um, and to add water to make a paste, the molecular sieve being coated, through screen printing, on the package cover at the inner side of the resin application location, and then to position the package cover in a high temperature oven for baking for hours at 120° C.-350° C. to remove water and form the molecular sieve film, the molecular sieve film having a width of 100 um-2000 um and a height of 1 um-100 um.

8. The OLED packaging method as claimed in claim 1, wherein in step (3), the frame resin (5) comprises a ultraviolet (UV) resin and the frame resin has a height corresponding to that of the desiccant layer.

9. An organic light emitting diode (OLED) packaging method, comprising the following steps:
   (1) providing an OLED substrate and a package cover and forming an alignment mark on the package cover;
   (2) forming a circle of patternized desiccant layer on the package cover;
   (3) coating a circle of frame resin on the package cover at an outer side of the desiccant layer;
   (4) attaching the package cover and the OLED substrate to each other; and
   (5) subjecting the frame resin to irradiation of a UV light source or heating for curing so as to complete packaging of the OLED substrate with the package cover;
   wherein the package cover is a glass substrate or a metal board; and the OLED substrate comprises a thin-film transistor (TFT) array formed thereon;
   wherein in step (2), the desiccant layer is formed on the package cover at an inner side of a resin application location where the frame resin is to be formed and in step (3), the frame resin is coated on the package cover at the resin application location where the frame resin is to be formed in such a way that the frame resin is immediately adjacent to the desiccant layer;
   wherein in step (2), an operation for forming the patternized desiccant layer is to directly cut a desiccant sheet into a desired pattern, which is attached to the package cover immediately adjacent to the inner side of the resin application location, the desiccant layer having a width of 100 um-2000 um and a height of 1 um-100 um; and wherein in step (3), the frame resin comprises a ultraviolet (UV) resin and the frame resin has a height corresponding to that of the desiccant layer.

10. An organic light emitting diode (OLED) packaging structure, comprising an OLED substrate, a package cover arranged above the OLED substrate, a frame resin arranged between the OLED substrate and the package cover, and a desiccant layer arranged between the OLED substrate and the package cover and located at an inner side of the frame resin.

11. The OLED packaging structure as claimed in claim 10, wherein the package cover comprises a glass substrate or a metal board, the OLED substrate comprising a thin-film transistor (TFT) array formed thereon, the frame resin being set immediately adjacent to the desiccant layer, the desiccant layer having a width of 100 um-2000 um and a height of 1 um-100 um, the desiccant layer comprising a molecular sieve film, the molecular sieve comprising silicates or aluminosilicates in a crystallized form, the frame resin comprising a ultraviolet (UV) resin, the frame resin having a height corresponding to that of the desiccant layer.

* * * * *